United States Patent
Lee et al.

(10) Patent No.: US 11,695,385 B2
(45) Date of Patent: Jul. 4, 2023

(54) BULK-ACOUSTIC WAVE RESONATOR

(71) Applicant: SAMSUNG ELECTRO-MECHANICS CO., LTD., Suwon-si (KR)

(72) Inventors: Tae Kyung Lee, Suwon-si (KR); Je Hong Kyoung, Suwon-si (KR); Sung Sun Kim, Suwon-si (KR); Jin Suk Son, Suwon-si (KR); Ran Hee Shin, Suwon-si (KR); Hwa Sun Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 985 days.

(21) Appl. No.: 16/449,561

(22) Filed: Jun. 24, 2019

(65) Prior Publication Data

US 2020/0266795 A1 Aug. 20, 2020

(30) Foreign Application Priority Data

Feb. 15, 2019 (KR) ........................ 10-2019-0017637

(51) Int. Cl.
  *H03H 9/02* (2006.01)
  *H03H 9/17* (2006.01)

(52) U.S. Cl.
  CPC .... *H03H 9/02102* (2013.01); *H03H 9/02031* (2013.01); *H03H 9/174* (2013.01); *H03H 9/176* (2013.01)

(58) Field of Classification Search
  CPC ........................... H03H 9/174; H03H 9/02102
  See application file for complete search history.

(56) References Cited

U.S. PATENT DOCUMENTS

| 2012/0107557 | A1  | 5/2012 | Akiyama et al. |
| 2013/0127300 | A1  | 5/2013 | Umeda et al. |
| 2016/0118957 | A1* | 4/2016 | Burak .................. H01L 41/0471 333/187 |
| 2017/0134003 | A1* | 5/2017 | Kawasaki .......... H03H 9/02944 |
| 2017/0179923 | A1* | 6/2017 | Shin ......................... H03H 3/02 |

(Continued)

FOREIGN PATENT DOCUMENTS

| CN | 106206888 A   | 12/2016 |
| EP | 0 548 862 A1  | 6/1993  |
| JP | 4036856 B2    | 1/2008  |

(Continued)

OTHER PUBLICATIONS

Korean Office Action dated Apr. 29, 2020 in the corresponding Korean Patent Application No. 10-2019-0017637 (6 pages in English and 5 pages in Korea).

(Continued)

*Primary Examiner* — Sarah K Salerno
(74) *Attorney, Agent, or Firm* — NSIP Law

(57) ABSTRACT

A bulk-acoustic wave resonator comprises a substrate, a resonant portion comprising a first electrode, a piezoelectric layer, and a second electrode sequentially stacked on the substrate, and further comprising a center portion and an extension portion that is disposed along a periphery of the center portion, and an insertion layer that is disposed in the extension portion between the first electrode and the piezoelectric layer, and the insertion layer is formed of an aluminum alloy containing scandium (Sc).

15 Claims, 8 Drawing Sheets

(56) References Cited

U.S. PATENT DOCUMENTS

2018/0254764 A1    9/2018  Lee et al.
2018/0351534 A1*  12/2018  Lee .......................... H03H 3/02

FOREIGN PATENT DOCUMENTS

| JP | 5817673 B2 | 11/2015 | |
|---|---|---|---|
| KR | 10-2012-0017089 A | 2/2012 | |
| KR | 10-2017-0073063 A | 6/2017 | |
| KR | 10-2018-0101129 A | 9/2018 | |
| KR | 10-2018-0131313 A | 12/2018 | |
| WO | WO 2016/017308 A1 | 2/2016 | |
| WO | WO-2017164709 A1 * | 9/2017 | ............. C22C 14/00 |

OTHER PUBLICATIONS

Korean Office Action dated Oct. 28, 2020 in counterpart Korean Patent Application No. 10-2019-0017637 (6 pages in English, 5 pages in Korean).
Chinese Office Action dated Mar. 13, 2023, in counterpart Chinese Patent Application No. 201910981147.6 (11 pages in English, 9 pages in Chinese).

* cited by examiner

| WIDTH OF SECOND ELECTRODE IN EXTENSION PORTION (um) | Atten (dB) | Kt²(%) | LENGTH OF SECOND ELECTRODE IN EXTENSION PORTION (um) / INCLINED SURFACE LENGTH (um) |
|---|---|---|---|
| -1.8 | 25.97 | 9.37 | -- |
| -1.6 | 25.98 | 9.37 | -- |
| -1.4 | 25.97 | 9.38 | -- |
| -1.2 | 25.22 | 9.37 | -- |
| -1 | 26.22 | 9.37 | -- |
| -0.8 | 25.35 | 9.35 | -- |
| -0.6 | 24.91 | 9.36 | -- |
| -0.4 | 24.33 | 9.43 | -- |
| -0.2 | 26.95 | 9.55 | -- |
| 0 | 27.52 | 9.5 | 0 |
| 0.2 | 31.13 | 9.59 | 0.23 |
| 0.4 | 39.32 | 9.49 | 0.46 |
| 0.6 | 41.15 | 9.39 | 0.69 |
| 0.8 | 38.29 | 9.33 | 0.92 |
| 1 | 35.34 | 9.29 | 1.15 |
| 1.2 | 33.4 | 9.26 | 1.38 |
| 1.4 | 32.78 | 9.24 | 1.61 |
| 1.6 | 33.75 | 9.23 | 1.84 |
| 1.8 | 35.19 | 9.2 | 2.07 |
| 2 | 37.65 | 9.15 | 2.3 |
| 2.2 | 39.98 | 9.09 | 2.53 |
| 2.4 | 38.83 | 9.02 | 2.76 |
| 2.6 | 36.49 | 8.97 | 2.99 |
| 2.8 | 34.93 | 8.94 | 3.22 |
| 3 | 34.96 | 8.9 | 3.45 |
| 3.2 | 35.67 | 8.88 | 3.68 |
| 3.4 | 36.6 | 8.84 | 3.91 |
| 3.6 | 37.24 | 8.79 | 4.14 |
| 3.8 | 37.37 | 8.75 | 4.37 |
| 4 | 37.81 | 8.71 | 4.6 |
| 4.2 | 38.76 | 8.66 | 4.83 |
| 4.4 | 38.28 | 8.62 | 5.06 |
| 4.6 | 36.71 | 8.57 | 5.29 |
| 4.8 | 35.4 | 8.54 | 5.52 |
| 5 | 35.06 | 8.5 | 5.75 |
| 5.2 | 35.02 | 8.48 | 5.98 |
| 5.4 | 35.52 | 8.45 | 6.21 |
| 5.6 | 35.78 | 8.43 | 6.44 |
| 5.8 | 36.28 | 8.39 | 6.67 |
| 6 | 36.78 | 8.33 | 6.9 |
| 6.2 | 37.37 | 8.27 | 7.13 |
| 6.4 | 36.54 | 8.24 | 7.36 |
| 6.6 | 34.77 | 8.22 | 7.59 |
| 6.8 | 35.55 | 8.19 | 7.82 |
| 7 | 36.41 | 8.14 | 8.05 |

FIG. 4

| FWHM (degree) | Pure Al | AlSc 6.25at% | AlSc 0.625at% |
|---|---|---|---|
| FIG. 7A<br>INSERTION LAYER | | | |
| FIG. 7B<br>PIEZOELECTRIC LAYER<br>(AlN) CRYSTAL<br>ORIENTATION | 1.73° (0002) | 2.19° (0002) | 0.78° (0002) |
| FIG. 7C<br>PIEZOELECTRIC<br>LAYER(AlN) | | | |

BULK-ACOUSTIC WAVE RESONATOR

CROSS-REFERENCE TO RELATED APPLICATION(S)

This application claims the benefit under 35 USC § 119(a) of Korean Patent Application No. 10-2019-0017637 filed on Feb. 15, 2019 in the Korean Intellectual Property Office, the entire disclosure of which is incorporated herein by reference for all purposes.

BACKGROUND

1. Field

The following description relates to a bulk-acoustic wave resonator.

2. Description of Related Art

As wireless communication devices are becoming more compact, there is an increased demand for the miniaturization of high-frequency components. As an example, provided is a filter in the form of a bulk-acoustic wave (BAW) resonator employing semiconductor thin-film wafer manufacturing technology.

A bulk-acoustic wave (BAW) resonator is a filter that is implemented with a thin-film device that causes resonance with piezoelectric characteristics obtained through a piezoelectric dielectric material that is deposited on a silicon wafer, which is a semiconductor substrate.

Recently, interest in 5G communications has increased, and technology, which can be implemented in a candidate band, has been actively developed.

A typical acoustic resonator may be operated in a frequency band of 2 GHz to 3 GHz for 4G, but it may be necessary to transmit high power, as compared with the typical acoustic resonator, in order to be operated in 5G communications with a frequency band of 6 GHz less (that is, sub-6 GHz, for example, 4 GHz to 6 GHz).

Therefore, in order to implement an acoustic resonator in 5G communications, a structure that is able to withstand high power is needed. In addition, as power increases, heat generation in a resonator increases, so that a bulk-acoustic wave resonator that effectively dissipates heat is needed.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a bulk-acoustic wave resonator includes a substrate a resonant portion, including a first electrode, a piezoelectric layer, and a second electrode sequentially stacked on the substrate, and further including a center portion, and an extension portion that is disposed along a periphery of the center portion, and an insertion layer that is disposed in the extension portion between the first electrode and the piezoelectric layer.

The insertion layer may be formed of an aluminum alloy containing scandium (Sc).

A seed layer may be formed of a metal material, and may be disposed between the first electrode and the insertion layer.

The seed layer may be formed of a metal having a hexagonal close packed (HCP) crystal structure.

The seed layer may be formed of a titanium (Ti) or ruthenium (Ru) material.

The piezoelectric layer may be formed of aluminum nitride (AlN) or doped aluminum nitride that contains a rare earth metal.

The rare earth metal may be formed of a metal containing one of scandium, erbium, yttrium, and lanthanum, or combinations thereof.

The content of the scandium (Sc) may be 0.1 at % to 5 at %.

The insertion layer may have a thickness of 100 Å or more, and has a thickness less than a thickness of the piezoelectric layer.

The insertion layer may have an inclined surface that has a thickness that increases as a distance of the inclined surface increases from the center portion, and the piezoelectric layer may include an inclined portion that is disposed on the inclined surface.

The second electrode may be provided with at least a portion thereof disposed on the inclined surface of the inclined portion of the piezoelectric layer.

A protective layer may be stacked on the second electrode.

The piezoelectric layer may include a piezoelectric portion disposed in the center portion, and a bent portion disposed in the extension portion, and extended from the piezoelectric portion to be inclined along a shape of the insertion layer.

In a general aspect, a bulk-acoustic wave resonator includes a substrate, a resonant portion, comprising a first electrode, a piezoelectric layer, and a second electrode sequentially stacked on the substrate, an insertion layer disposed between the piezoelectric layer and the first electrode, and configured to be formed with an aluminum alloy containing scandium in a range of 0.1 at % to 5 at %; and a seed layer, disposed between the insertion layer and the first electrode, and formed to contain one of a titanium element and a ruthenium material.

The titanium element of the seed layer may have a hexagonal close packed (HCP) crystal structure.

The insertion layer may have a face-centered cubic (FCC) crystal structure.

Other features and aspects will be apparent from the following detailed description, the drawings, and the claims.

BRIEF DESCRIPTION OF DRAWINGS

FIG. 4 is a table summarizing a value of the graph illustrated in FIG. 3;

FIGS. 7A to 7C are views comparing the example in which an insertion layer is formed of pure aluminum (Pure Al), with the case in which an insertion layer is formed of an aluminum alloy material containing scandium (Sc)

Figure 1:
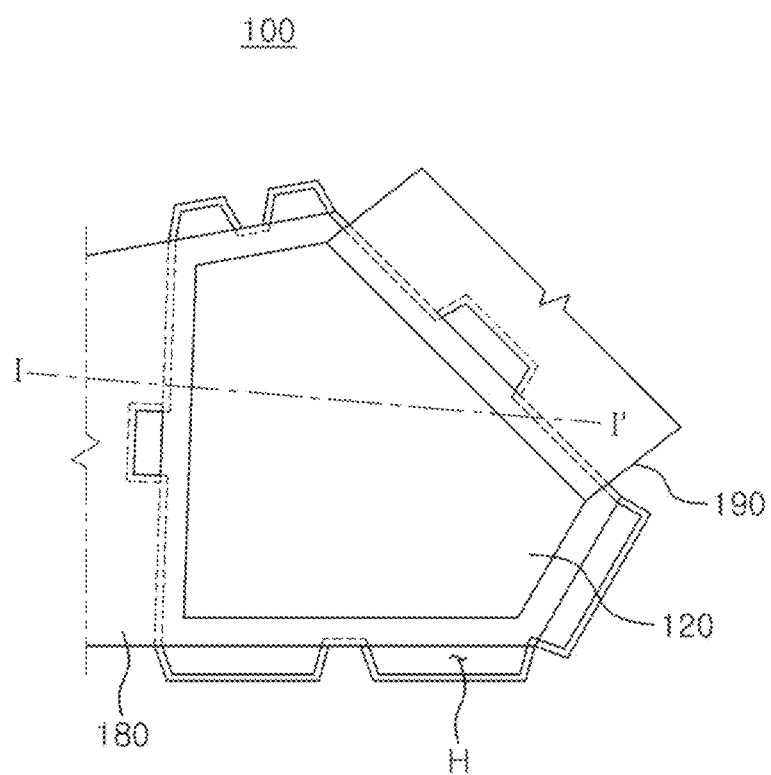
FIG. 1 is a plan view of an acoustic resonator according to one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known may be omitted for increased clarity and conciseness.

The features described herein may be embodied in many different forms and should not be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

Although terms such as first, second, third, etc. may be used herein to describe various members, components, regions, layers and/or sections, these members, components, regions, layers and/or sections are not to be limited by these terms. Rather, these terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element or elements as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

Unless otherwise defined, all terms, including technical and scientific terms, used herein have the same meaning as commonly understood by one of ordinary skill in the art to which this disclosure pertains after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

The contents of the present disclosure described below may have a variety of configurations and propose only a required configuration herein, but are not limited thereto.

Figure 2:
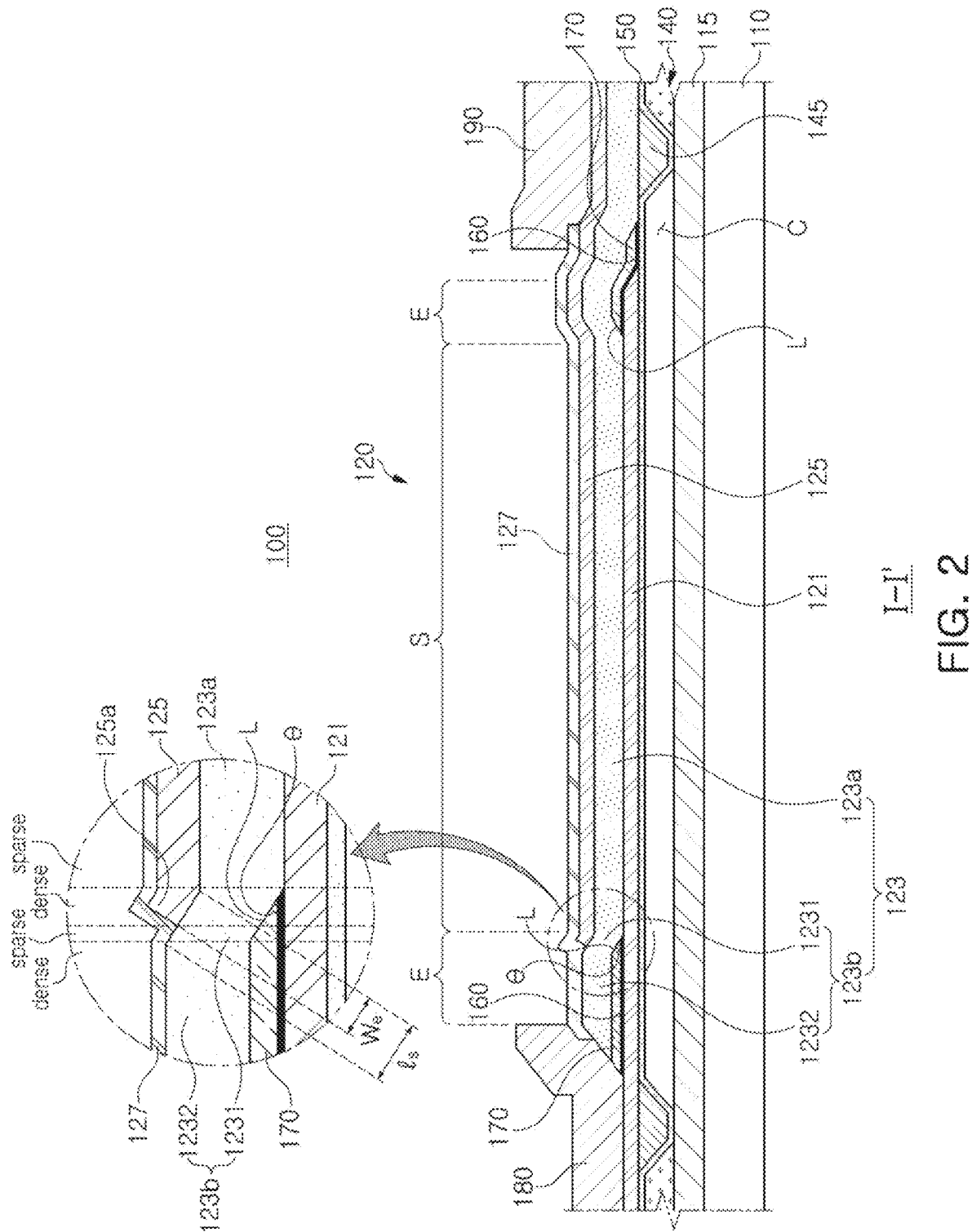
FIG. 2 is a cross-sectional view taken along line I-I' of FIG. 1.

FIG. 1 is a plan view illustrating an acoustic resonator according to one or more embodiments, and FIG. 2 is a cross-sectional view taken along line I-I' of FIG. 1.

Referring to FIGS. 1 and 2, an acoustic resonator 100 according to one or more embodiments may be a bulk acoustic wave (BAW) resonator, and may include a substrate 110, a sacrificial layer 140, a resonant portion 120, and an insertion layer 170.

The substrate 110 may be a silicon substrate. In a non-limiting example, a silicon wafer or a silicon-on-insulator (SOI) substrate may be used as the substrate 110.

An insulating layer 115 may be provided on an upper surface of the substrate 110, and may electrically isolate the substrate 110 and the resonant portion 120 from each other. Moreover, the insulating layer 115 may prevent the substrate 110 from being etched by an etching gas, when a cavity C is formed during a method of manufacturing an acoustic resonator.

In this example, the insulating layer 115 may be formed of at least one among silicon dioxide ($SiO_2$), silicon nitride ($Si_3N_4$), aluminum oxide ($Al_2O_3$), and aluminum nitride (AlN), and may be formed through one of processes such as chemical vapor deposition, RF magnetron sputtering, and evaporation.

The sacrificial layer 140 may be formed on the insulating layer 115, and the cavity C and the etch-stop portion 145 may be disposed in the sacrificial layer 140.

The cavity C is formed as an empty space, and may be formed by removing a portion of the sacrificial layer 140.

As the cavity C is formed in the sacrificial layer 140, the entirety of the resonant portion 120, formed above the sacrificial layer 140, may be formed to be flat.

The etch-stop portion 145 may be disposed along a boundary of the cavity C. The etch-stop portion 145 is provided to prevent etching from proceeding into a cavity region during formation of the cavity C.

The membrane layer 150 may be formed on the sacrificial layer 140, and may form an upper surface of the cavity C. Thus, the membrane layer 150 may also be formed of a material which is not easily removed during a process for forming the cavity C.

For example, when a halide-based etching gas such as fluorine (F), chlorine (Cl), or the like, is used in order to remove a portion of the sacrificial layer 140 (for example, a cavity region), the membrane layer 150 may be formed of a material having a low reactivity with the etching gas described above. In this example, the membrane layer 150 may include at least one between silicon dioxide ($SiO_2$) and silicon nitride ($Si_3N_4$).

Moreover, the membrane layer 150 may include a dielectric layer including at least one among magnesium oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), or may include a metal layer including at least one among aluminum (Al), nickel (Ni), chrome (Cr), platinum (Pt), gallium (Ga), and hafnium (Hf). The configuration of the various examples is not, however, limited thereto.

A lower seed layer (not shown), formed of aluminum nitride (AlN), may be formed on the membrane layer 150 for deposition of the first electrode 121. In detail, the lower seed layer may be disposed between the membrane layer 150 and the first electrode 121. The lower seed layer may be formed using a dielectric or metal, having a hexagonally closed packed (HCP) structure, in addition to AlN. In the example of the metal, for example, the lower seed layer may be formed of titanium (Ti).

The resonant portion 120 may include a first electrode 121, a piezoelectric layer 123, and a second electrode 125. In the resonant portion 120, the first electrode 121, the piezoelectric layer 123, and the second electrode 125 may be stacked from bottom to top. Thus, in the resonant portion 120, the piezoelectric layer 123 may be disposed between the first electrode 121 and the second electrode 125.

In an example, the resonant portion 120 is formed on the membrane layer 150, and as a result, the membrane layer 150, the first electrode 121, the piezoelectric layer 123, and the second electrode 125 are sequentially stacked to form the resonant portion 120.

The resonant portion 120 may resonate the piezoelectric layer 123 according to a signal, applied to the first electrode 121 and the second electrode 125, to generate a resonance frequency and an antiresonance frequency.

The resonant portion 120 may be divided into a center portion S, in which the membrane layer 150, the first electrode 121, the piezoelectric layer 123, and the second electrode 125 are stacked to be substantially flat, and an extension portion E with the insertion layer 170 interposed between the first electrode 121 and the piezoelectric layer 123.

The center portion S is a region disposed in the center of the resonant portion 120, and the extension portion E is a region disposed along a periphery of the center portion S. Thus, the extension portion E is a region that extends externally from the center portion S, and indicates a region formed to have a continuous annular shape along the periphery of the center portion S. However, in an example, the extension portion may be configured to have a discontinuous annular shape, in which some regions are disconnected.

Accordingly, as illustrated in FIG. 2, in a cross section in which the resonant portion 120 is cut to intersect the center portion S, the extension portion E is disposed on each of both ends of the center portion S.

The insertion layer 170 may have an inclined surface L of which a thickness becomes greater as a distance from the center portion S increases. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

In the extension portion E, the piezoelectric layer 123 and the second electrode 125 may be disposed on the insertion layer 170. Thus, the piezoelectric layer 123 and the second electrode 125, located in the extension portion E, may have an inclined surface along a shape of the insertion layer 170.

Meanwhile, in the present example, the extension portion E may be included in the resonant portion 120, and thus resonance may occur even in the extension portion E. However, it is not limited thereto, and resonance may not occur in the extension portion E, but may occur in the center portion S, depending on a structure of the extension portion E.

The first electrode 121 and the second electrode 125 may be formed of a conductor, for example, gold, molybdenum, ruthenium, iridium, aluminum, platinum, titanium, tungsten, palladium, tantalum, chromium, nickel, or a metal containing at least one among them, but it is not limited thereto.

In a non-limiting example, the first electrode 121 may have an area wider than an area of the second electrode 125 in the resonant portion 120, and a first metal layer 180 may be disposed on the first electrode 121 along or above an outer edge of the first electrode 121. Thus, the first metal layer 180 may be spaced apart from the second electrode 125 by a predetermined distance, and may be disposed to surround the resonant portion 120.

In a non-limiting example, since the first electrode 121 is disposed on the membrane layer 150, the first electrode may be entirely flat. On the other hand, since the second electrode 125 is disposed on the piezoelectric layer 123, the second electrode may have a bent portion corresponding to a shape of the piezoelectric layer 123.

The first electrode 121 may be used as one of an input electrode and an output electrode, which inputs and outputs an electrical signal such as a radio frequency (RF) signal, or the like.

The second electrode 125 may be entirely disposed in the center portion S, and may be partially disposed in the extension portion E. Thus, the second electrode 125 may be divided into a portion that is disposed on the piezoelectric portion 123a of the piezoelectric layer 123, to be described later, and a portion that is disposed on the bent portion 123b of the piezoelectric layer 123.

In further detail, in an example, the second electrode 125 may be disposed in the form of covering the entirety of the piezoelectric portion 123a, and a portion of an inclined portion 1231 of the piezoelectric layer 123. Thus, the second electrode 125a, disposed in the extension portion E, may be formed to have an area smaller than an area of an inclined surface of the inclined portion 1231, and the second electrode 125, disposed in the resonant portion 120, may be formed to have an area smaller than an area of the piezoelectric layer 123.

Accordingly, as illustrated in FIG. 2, in a cross section in which the resonant portion 120 is cut to cross the center portion S, an end of the second electrode 125 may be disposed in the extension portion E. Moreover, at least a portion of the end of the second electrode 125, disposed in the extension portion E, may be disposed to overlap the insertion layer 170. Here, 'overlap' indicates that a shape of the second electrode 125, projected on a plane, overlaps the insertion layer 170, when the second electrode 125 is projected on the plane on which the insertion layer 170 is disposed.

The second electrode 125 may be used as one of an input electrode and an output electrode, which inputs and outputs an electrical signal such as an RF signal, or the like. In other words, when the first electrode 121 is used as an input electrode, the second electrode 125 may be used as an output electrode. Alternatively, when the first electrode 121 is used as an output electrode, the second electrode 125 may be used as an input electrode.

The piezoelectric layer 123 may be formed on the first electrode 121, and the insertion layer 170, to be described later.

Zinc oxide (ZnO), aluminum nitride (AlN), doped aluminum nitride, lead zirconate titanate, and quartz may be selectively used as a material of the piezoelectric layer 123. In the case of the doped aluminum nitride, a rare earth metal, a transition metal, or an alkaline earth metal may be further included. For example, the rare earth metal may include at least one among scandium (Sc), erbium (Er), yttrium (Y), and lanthanum (La). The transition metal may include at least one among hafnium (Hf), titanium (Ti), zirconium (Zr), tantalum (Ta), and niobium (Nb). Moreover, the alkaline earth metal may include magnesium (Mg).

The piezoelectric layer 123 according to the present example includes a piezoelectric portion 123a disposed in the center portion S, and a bent portion 123b disposed in the extension portion E.

The piezoelectric portion 123a is a portion that is directly stacked on an upper surface of the first electrode 121. Thus, the piezoelectric portion 123a is interposed between the first electrode 121 and the second electrode 125, to be flat with the first electrode 121 and the second electrode 125.

The bent portion 123b may be defined as a region that extends outwardly from the piezoelectric portion 123a, and may be located within the extension portion E.

The bent portion 123b may be disposed on the insertion layer 170, to be described later, and an upper surface of the bent portion may be formed to have a shape which rises along a shape of the insertion layer 170. Thus, the piezoelectric layer 123 may be bent at a boundary between the piezoelectric portion 123a and the bent portion 123b, and the bent portion 123b may rise to correspond to a thickness and a shape, of the insertion layer 170.

The bent portion 123b may be divided into an inclined portion 1231 and an outwardly extended portion 1232.

The inclined portion 1231 refers to a portion formed to be inclined along an inclined surface L of the insertion layer 170, to be described later. Moreover, the extended portion 1232 refers to a portion that extends outwardly from the inclined portion 1231.

The inclined portion 1231 may be formed parallel to the inclined surface L of the insertion layer 170, and an inclination angle of the inclined portion 1231 may be equal to an inclination angle of the inclined surface L of the insertion layer 170.

The insertion layer 170 is disposed on a surface formed by the membrane layer 150 and the first electrode 121, and the etching preventing portion 145.

The insertion layer 170 may be disposed around the center portion S and supports the bent portion 123b of the piezoelectric layer 123. Thus, the bent portion 123b of the piezoelectric layer 123 may be divided into an inclined portion 1231 and an extended portion 1232, along a shape of the insertion layer 170.

The insertion layer 170 may be disposed in a region except for the center portion S. For example, the insertion layer 170 may be disposed in the entirety of a region of the expansion portion E on the substrate 110, or in some regions. Moreover, the insertion layer may extend outwardly of the expansion portion E, as needed.

The insertion layer 170 may be formed to have a thickness that increases as a distance from the center portion S increases. Thus, the insertion layer 170 has a side surface, disposed to be adjacent to the center portion S, as an inclined surface L having a constant inclination angle $\theta$.

If the inclination angle $\theta$ of the side surface of the insertion layer 170 is formed to be less than 5°, in order to manufacture this, a thickness of the insertion layer 170 may be significantly small, or an area of the inclined surface L may be significantly large. Hence, there may be difficulty in its substantial implementation.

Moreover, if the inclination angle $\theta$ of a side surface of the insertion layer 170 is formed to be greater than 70°, an inclination angle of the piezoelectric layer 123 or the second electrode 125, stacked on the insertion layer 170, may also be formed to be greater than 70°. In this example, the piezoelectric layer 123 or the second electrode 125, stacked on the inclined surface L, may be excessively bent, and thus cracking may occur in a bent portion.

Thus, in an example, the inclination angle $\theta$ of the inclined surface L is formed in a range of 5° or more and 70° or less.

Meanwhile, in the present example, the inclined portion 1231 of the piezoelectric layer 123 may be formed along the inclined surface L of the insertion layer 170, and may thus be formed to have an inclination angle, equal to that of the inclined surface L of the insertion layer 170. Thus, the inclination angle of the inclined portion 1231 is formed in a range of 5° or more and 70° or less, in a manner similar to the inclined surface L of the insertion layer 170. This configuration is also applied to the second electrode 125 stacked on the inclined surface L of the insertion layer 170.

The insertion layer 170 may be formed of an aluminum alloy material containing scandium (Sc).

Typically, a material of the insertion layer 170 is silicon oxide ($SiO_2$). In this example, thermal conductivity of the insertion layer 170 may be low. Thus, when the insertion layer is used in 5G communications, heat, generated by the resonant portion 120, is difficult to be released smoothly.

In this regard, a consideration may be made to use pure aluminum (Al), not containing scandium (Sc), or an aluminum alloy, containing copper (Cu) or silicon (Si), as a material of the insertion layer 170. However, in the example of the pure aluminum (Al), a melting point is 660° C. In addition, as copper (Cu) or silicon (Si) is contained in the aluminum (Al), there may be a problem in that a melting point becomes lower. For example, as the content of copper (Cu) is increased, it was confirmed that a melting point of an aluminum-copper (Al—Cu) alloy is lowered by up to 540° C.

As described above, when pure aluminum (Al), or an aluminum alloy containing copper (Cu) or silicon (Si) is used as a material of the insertion layer 170, a heat release effect may be increased as compared with the related art using silicon oxide ($SiO_2$). However, as a temperature is increased, there may be a problem in which a melting point becomes lower.

On the other hand, an aluminum alloy material containing scandium (Sc) may be used for formation of the insertion layer 170. In this example, as the content of scandium (Sc) is increased, it was confirmed that a melting point becomes higher than a melting point of pure aluminum.

When the content of scandium (Sc) is 1 wt %, it was confirmed that a melting point is increased to 740° C. In addition, when the content of scandium (Sc) is 2 wt %, it was confirmed that a melting point is increased to 830° C.

As described above, when scandium (Sc) is contained in aluminum, a melting point is further increased, so thermal migration is significantly reduced. Moreover, since the mechanical strength of the insertion layer 170 could be improved, deposition of the piezoelectric layer 123 could be more stably performed in a sputtering process, so that the crystal orientation could be improved and the chemical resistance could be improved to secure the manufacturing stability.

FIG. 7 is a view comparing the example in which an insertion layer is formed of pure aluminum (Pure Al), with the example in which an insertion layer is formed of an aluminum alloy material containing scandium (Sc).

In FIG. 7A, a surface defect was observed after pure aluminum (Al) and an aluminum alloy containing scandium (Sc) are deposited to have a thickness of 1500 Å. In the example of the pure aluminum (Al), a large amount of defects caused by the hillock and grain boundary groove were observed. However, in the example of the aluminum alloy (AlSc) containing scandium (Sc), it was confirmed that a defect, caused by the hillock and grain boundary groove, was significantly reduced. Here, if the content of scandium (Sc) is excessive, it was confirmed that surface roughness is rather increased.

FIG. 7B illustrates a result of comparing a crystal orientation of a thin film by depositing pure aluminum (Al) and an aluminum alloy (AlSc) containing scandium (Sc) to have a thickness of 1500 Å, and then depositing aluminum nitride (AlN), the piezoelectric layer 123, to have a thickness of 5000 Å, and, in FIG. 7C, a surface defect of aluminum nitride (AlN), the piezoelectric layer 123, was observed.

Referring to FIGS. 7B and 7C, in the example in which aluminum nitride (AlN) is deposited on pure aluminum (Al), due to a surface defect of the pure aluminum (Al), a crystal orientation was 1.73°.

On the other hand, in the example of an aluminum alloy (AlSc) containing scandium (Sc) of 0.625 at %, when aluminum nitride (AlN) is deposited, a crystal orientation is 0.78°, which is a significantly excellent crystal orientation.

On the other hand, in the example of an aluminum alloy (AlSc) containing scandium (Sc) of 6.25 at %, due to an increase in surface roughness, when aluminum nitride (AlN) is deposited, a crystal orientation was measured to 2.19°. Thus, if scandium (Sc) is excessively contained, it was confirmed that a crystal orientation is rather deteriorated.

In the example of the acoustic resonator according to a non-limiting example illustrated in FIG. 2, as a crystal orientation of the piezoelectric layer 123 stacked above the insertion layer 170 in the extension portion E is improved, heat, generated by the center portion S, may be released more effectively.

If the content of scandium (Sc) is less than 0.1 at %, due to aluminum (Al), mechanical properties may be reduced and hillock may occur. If the content of scandium (Sc) is 5 at % or more, it may be difficult to improve electrical loss, indicating sheet resistance. Moreover, if the content of scandium (Sc) is increased, surface roughness is increased, which may adversely affect a crystal orientation.

In this regard, in a bulk-acoustic wave resonator according to an embodiment, the insertion layer 170 may be formed using an aluminum alloy (AlSc) containing scandium (Sc) in a range of 0.1 at % to 5 at %. Accordingly, deposition of the piezoelectric layer 123 could be more stably performed in a sputtering process, so that the crystal orientation of the piezoelectric layer 123 could be improved, and the chemical resistance could be improved to secure the manufacturing stability.

On the other hand, in a metal thin film, with regard to thermal conductivity, phonon vibrations are a dominant role of heat transfer. In this regard, in the example of a dielectric material rather than a metal, thermal conductivity may vary depending on a degree of transmission of phonon vibrations are transmitted.

One of the factors suppressing movement of a phonon is a membranous layer of a thin film. If the membranous layer is deteriorated, the movement of a phonon is suppressed by a void, a defect, or the like, so thermal conductivity is reduced. On the other hand, as a crystal orientation is improved, a density of the thin film is high. Thus, the factors suppressing the movement of a phonon are reduced.

In the example of pure aluminum (Al), or an aluminum alloy containing copper (Cu) or silicon (Si), a melting point is low. In this example, as a temperature of a resonant portion is increased, a defect may easily occur in a thin film.

On the other hand, when the insertion layer 170 is formed using an aluminum alloy containing scandium (Sc), a crystal orientation of a piezoelectric layer 123, deposited above the insertion layer 170, becomes better. Thus, heat release in a lateral direction of a resonator may be obtained more smoothly. Thus, it may be more stably operated even in 5G communications.

Figure 8:
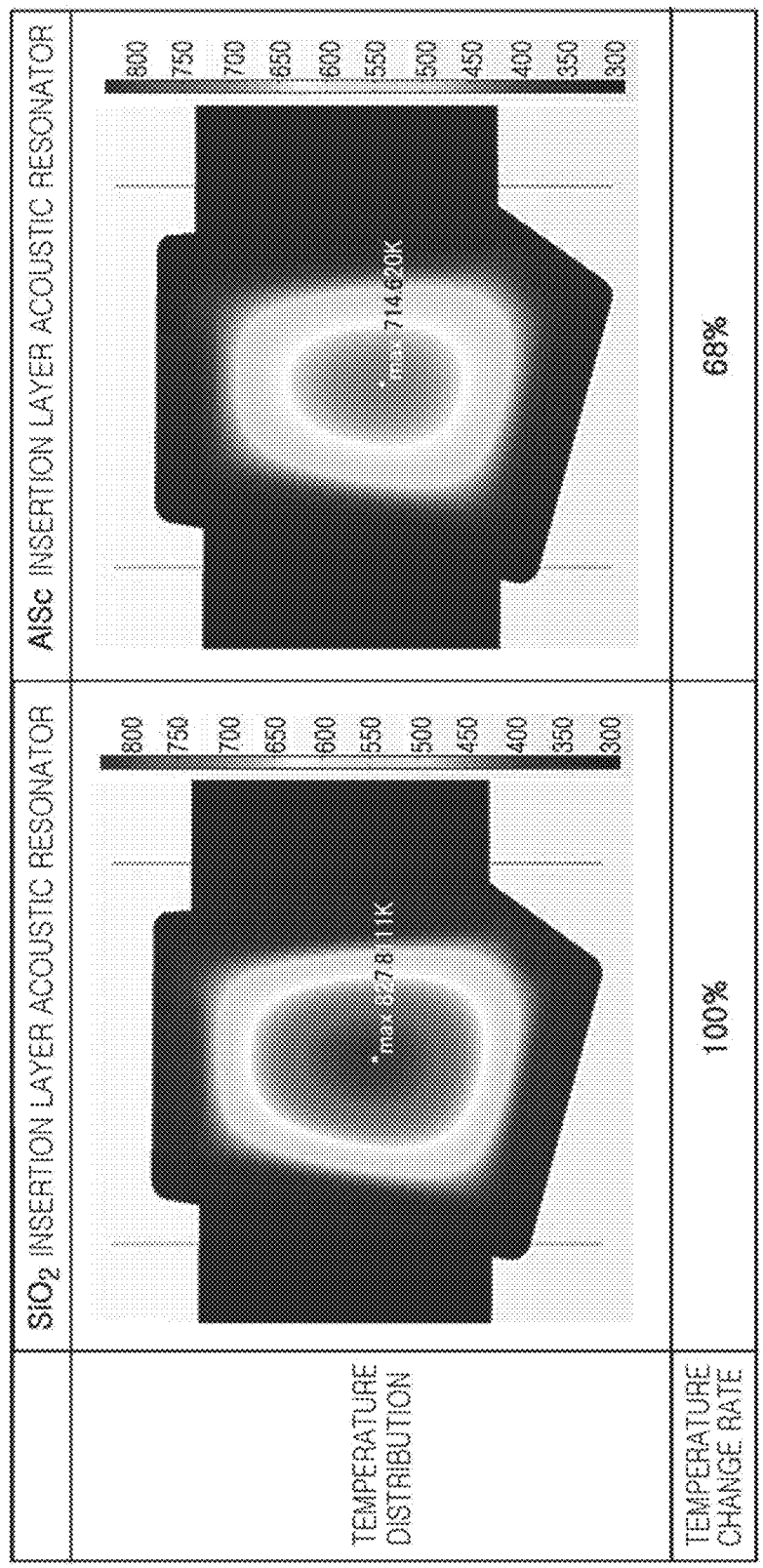
FIG. 8 is a view comparing temperature distributions during operations of an acoustic resonator in which an insertion layer is formed using silicon oxide ($SiO_2$), a dielectric material, and an acoustic resonator in which an insertion layer is formed of an aluminum alloy material containing scandium (Sc).

FIG. 8 is an example illustrating comparisons of temperature distributions during operations of an acoustic resonator in which an insertion layer is formed using silicon oxide ($SiO_2$), a dielectric material, and an acoustic resonator in which an insertion layer is formed of an aluminum alloy material containing scandium (Sc). A temperature, indicated in the drawings, is represented by Kelvin temperature.

Referring to FIG. 8, based on a temperature $T_0$ measured by an acoustic resonator in which an insertion layer is formed using silicon oxide ($SiO_2$), it was measured that a temperature T of an acoustic resonator, in which an insertion layer is formed with an aluminum alloy material containing scandium (Sc), is 0.68 $T_0$.

Moreover, it was measured that a maximum temperature of an acoustic resonator in which an insertion layer is formed using silicon oxide ($SiO_2$) is 827.8111 K (about 554° C.), while it was measured that a maximum temperature of an acoustic resonator in which an insertion layer is formed using an aluminum alloy material containing scandium (Sc) is 714.620 K (about 441° C.).

As described above, it was confirmed that the acoustic resonator according to an embodiment provides a significant heat release effect when an insertion if formed with an aluminum alloy material containing scandium (Sc) as compared with a typical acoustic resonator in which an insertion layer is formed using silicon oxide (SiO$_2$).

In a non-limiting example, in an acoustic resonator according to an embodiment, a seed layer 160 (FIG. 2) may be disposed in a lower portion of the insertion layer 170.

The seed layer 160 may be disposed on a lower surface of the insertion layer 170, and may thus be disposed on the first electrode 121 or the membrane layer 150, thereby functioning as a seed for formation of the insertion layer 170. In a non-limiting example, the seed layer 160 may have a hexagonal close packed (HCP) crystal structure. In this example, lattice mismatch of the insertion layer 170 may be reduced, and sheet resistance of the insertion layer 170 may be improved. As an example which has the effect described above, the seed layer 160 may include a titanium (Ti) element, for example, a titanium (Ti) layer. Moreover, the seed layer 160 may include a ruthenium (Ru) element, for example, a titanium (Ti) layer.

Here, the seed layer 160 may have an HCP crystal structure, while the insertion layer 170 may have a face-centered cubic (FCC) crystal structure.

When the seed layer 160 is formed using titanium (Ti) having a hexagonal close packed (HCP) crystal structure, it was confirmed that the lattice mismatch with the insertion layer 170, formed of an AlSc material, is improved from 8.8% to 3.01%. Thus, a crystal orientation of the insertion layer 170 was improved, and it was also confirmed that a crystal orientation of a piezoelectric layer 123, ultimately formed using aluminum nitride (AlN), is significantly improved.

Moreover, when the seed layer 160 is formed using ruthenium (Ru), an increase amount of a crystal orientation is small as compared with the case of the titanium (Ti). However, it was confirmed that sheet resistance of the AlSc insertion layer 170 is significantly reduced. When the seed layer 160 is formed using titanium (Ti), sheet resistance of the insertion layer 170 was measured to 0.275 ohm/sq. However, when the seed layer 160 is formed using ruthenium (Ru), sheet resistance was measured to be 0.220 ohm/sq, which is significantly low.

As described above, when an acoustic resonator operated in a frequency band of 6 GHz or more is manufactured, a seed layer 160, formed of a Ti or Ru material, is added. In this example, a crystal orientation of the piezoelectric layer 123 may be improved, while electrical resistance of the insertion layer 170 may also be improved. When the seed layer 160 is formed of Ti or Ru, the seed layer 160 may be comprised of a layer having an HCP crystal structure and a (0001) crystal face. Also, the insertion layer 170, formed of an AlSc material, may have an FCC crystal structure and a (111) crystal face.

In an embodiment, a thickness of the insertion layer 170 may be less than a thickness of the piezoelectric layer 123. If the insertion layer is thicker than the piezoelectric layer 123, it may be difficult to form a bent portion which could be formed along the insertion layer 170. Moreover, when the insertion layer 170 has a thickness of 100 Å or more, the bent portion 123b may be easily formed.

The resonant portion 120 may be spaced apart from the substrate 110 through the cavity C, provided as an empty space.

The cavity C may be formed by removing a portion of the sacrificial layer 140 by supplying an etching gas (or an etching solution) to an inlet hole (H of FIG. 1) during a process for manufacturing an acoustic resonator.

Referring to FIG. 2, the protective layer 127 is disposed along a surface of the acoustic resonator 100 to protect the acoustic resonator 100 from external elements. The protective layer 127 may be disposed along a surface formed by the second electrode 125 and the bent portion 123b of the piezoelectric layer 123.

The protective layer 127 may be formed of a dielectric layer containing any one material among silicon nitride (Si$_3$N$_4$), silicon oxide (SiO$_2$), magnesium oxide (MgO), zirconium oxide (ZrO$_2$), aluminum nitride (AlN), lead zirconate titanate (PZT), gallium arsenide (GaAs), hafnium oxide (HfO$_2$), aluminum oxide (Al$_2$O$_3$), titanium oxide (TiO$_2$), and zinc oxide (ZnO), but is not limited thereto.

In a non-limiting example, the protective layer 127 may include a single layer. Alternatively, two layers, formed of different materials, may be stacked to form the protective layer, if necessary. Moreover, the protective layer 127 may be partially removed in order to control a frequency in a final process. For example, a thickness of the protective layer 127 may be adjusted in a subsequent process.

Meanwhile, the first electrode 121 and the second electrode 125 may be extended outwardly of the resonant portion 120. Moreover, the first metal layer 180 and the second metal layer 190 may be disposed on upper surfaces of extended portions E as described above, respectively.

The first metal layer 180 and the second metal layer 190 may be formed of a material such as gold (Au), a gold-tin (Au—Sn) alloy, copper (Cu), a copper-tin (Cu—Sn) alloy, aluminum (Al), an aluminum (Al) alloy, but are not limited thereto. Here, the aluminum alloy may be an aluminum-germanium (Al—Ge) alloy or an aluminum-scandium (Al—Sc) alloy.

The first metal layer 180 and the second metal layer 190 may serve as a connection wiring, electrically connecting the electrodes 121 and 125 of the acoustic resonator according to the present example, to an electrode of another acoustic resonator disposed adjacent thereto, on the substrate 110, or as a terminal for external connection. The examples are not, however, limited thereto.

The first metal layer 180 passes through the protective layer 127 to be bonded to the first electrode 121.

Moreover, the first electrode 121 has an area wider than that of the second electrode 125 in the resonant portion 120, and a first metal layer 180 is formed in a peripheral portion of the first electrode 121.

Thus, the first metal layer 180 may be disposed along a periphery of the resonant portion 120, and is disposed to surround the second electrode 125. The examples are not, however, limited thereto.

In the acoustic resonator according to an embodiment configured as described above, as described above, the second electrode 125 may be stacked on the piezoelectric portion 123a and the inclined portion 1231 of the piezoelectric layer 123. Moreover, a portion of the second electrode 125, disposed on the inclined portion 1231 of the piezoelectric layer 123, may only be disposed on a portion of the inclined surface, rather than the entirety of the inclined surface of the inclined portion 1231.

Figure 3:
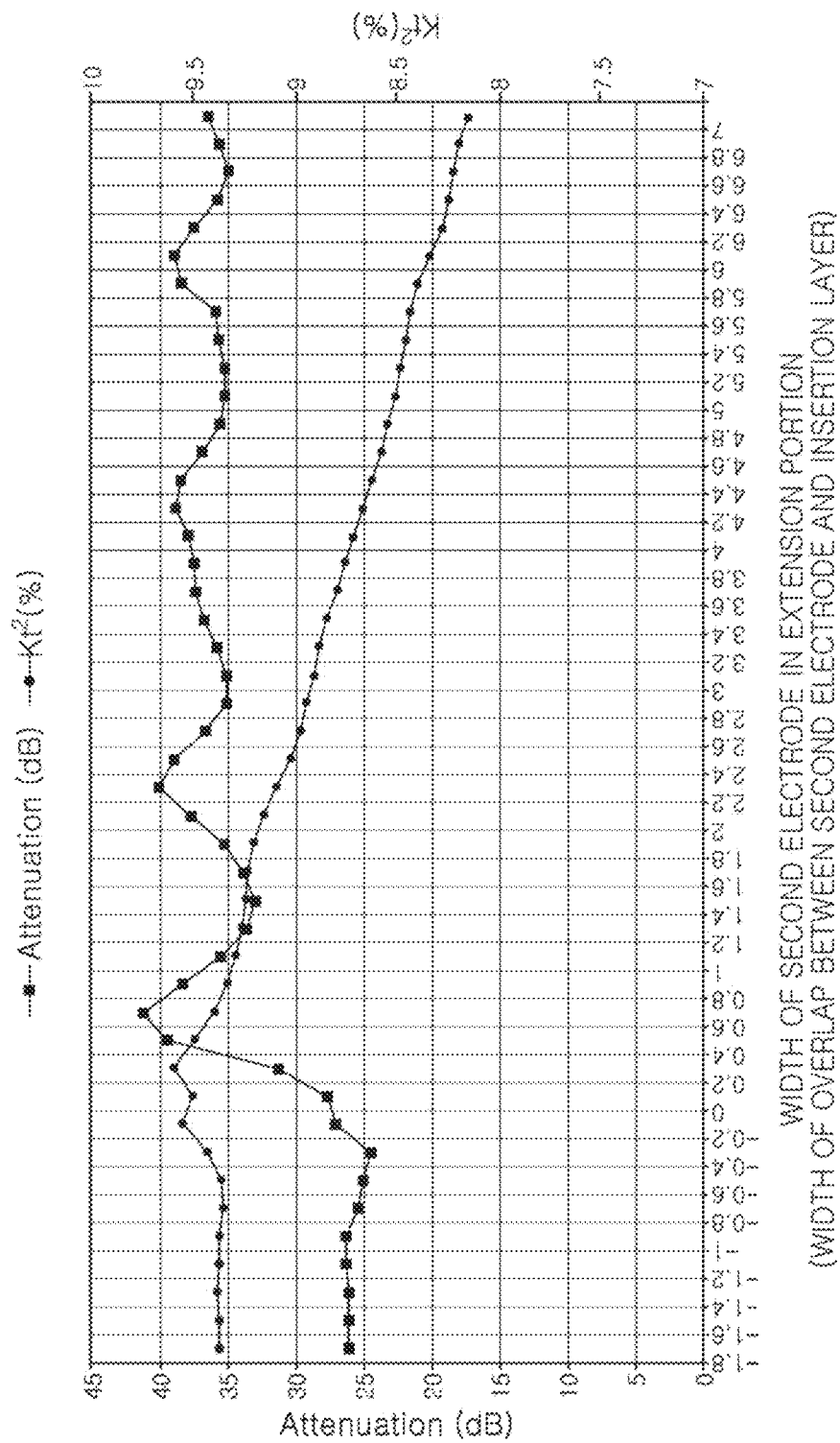
FIG. 3 is a graph illustrating resonance performance of an acoustic resonator, according to a structure of a second electrode of an acoustic resonator according to one or more embodiments.

FIG. 3 is a graph in which a resonance performance of an acoustic resonator according to a structure of a second electrode of an acoustic resonator according to an example is measured and illustrated, and FIG. 4 is a table summarizing a value of the graph illustrated in FIG. 3.

The acoustic resonator, used in the measurement, is an acoustic resonator illustrated in FIGS. 1 to 3, a thickness of the insertion layer 170 is 3000 Å, an inclination angle θ of an inclined surface L of the insertion layer 170 is 20°, and a length ($l_e$, or a width) of the inclined surface L is 0.87 μm.

On the other hand, in an example, an inclined surface of the piezoelectric layer 123 may be formed along an inclined surface of the insertion layer 170 to have the same shape, and thus a length of the inclined surface of the piezoelectric layer 123 may be regarded as being equal to a length $l_s$ of the inclined surface L of the insertion layer.

Referring to FIG. 3, FIG. 3 is a graph in which attenuation of an acoustic resonator is measured while a width $W_e$ of the second electrode 125a disposed in an extension portion E in the acoustic resonator described above is changed.

In FIG. 3, a Y-axis represents attenuation of the acoustic resonator. In the present example, a large attenuation of an acoustic resonator means that loss, occurring as a lateral wave flows outwardly of the resonant portion 120, is small. Consequently, it means that a performance of the acoustic resonator may be improved.

Moreover, an X-axis represents a width $W_e$ at an end of the second electrode 125a disposed in the extension portion E in the acoustic resonator. Thus, a section in the X-axis, indicated by a positive number, indicates a distance, in which the second electrode 125a and the insertion layer are overlapped within the extension portion E, while a section, indicated by a negative number, indicates a horizontal distance, in which the second electrode 125a is spaced apart from the insertion layer (or an extension portion). Moreover, 0 μm refers to a state in which an end of the second electrode 125a is disposed along a boundary between the center portion S and the extension portion E while the second electrode 125a and the insertion layer 170 are not overlapped.

Moreover, FIG. 3 illustrates a value of $Kt^2(\%)$ of an acoustic resonator according to a width $W_e$ of a second electrode in an extension portion E. Here, the $Kt^2(\%)$ indicates piezoelectric characteristics for a structure of a resonant portion.

Referring to FIGS. 3 and 4, based on a configuration in which an end of the second electrode 125 is disposed along a boundary the same as the insertion layer 170 (X-axis: 0 μm), as a value of the X-axis increases, characteristics of the attenuation increase. On the contrary, when the value of the X-axis decreases, the second electrode 125 moves away from a boundary with the insertion layer 170. In this example, attenuation becomes lower, and thus characteristics of the acoustic resonator are degraded.

This is a result of increasing a reflection performance of a lateral wave in the extension portion E. As illustrated in FIG. 2, when the second electrode 125 is located on the inclined surface of the insertion layer 170, a local structure of the acoustic impedance of the resonant portion 120 may be a sparse/dense/sparse/dense structure. Thus, a reflective interface for reflecting a lateral wave inwardly of the resonant portion 120 is increased. Thus, most lateral waves could not flow outwardly of the resonant portion 120, and are reflected and then flow to an interior of the resonant portion 120, thereby improving attenuation characteristics.

Moreover, in an acoustic resonator in which a length $l_s$ of an inclined surface of a piezoelectric layer 123 is 0.87 μm in an extension portion E, when a width $W_e$ of the second electrode 125a, stacked on the inclined surface of the piezoelectric layer 123, is 0.4 μm to 0.8 μm, attenuation is the largest, and this means that loss, caused by the outflow of the lateral wave outwardly of the resonant portion 120, is significantly reduced. Moreover, when the width $W_e$ of the second electrode 125a in the extension portion E is larger or smaller than the width described above, it was measured that attenuation is reduced, and thus a resonance performance may be degraded.

On the other hand, considering a ratio $W_e/l_s$ of a width $W_e$ of the second electrode 125 and a length $l_s$ of an inclined surface in the extension portion E, as illustrated in FIG. 3, attenuation is maintained to 38 dB or more in the example of the ratio $W_e/l_s$ between 0.46 and 0.92.

Thus, in order to secure a resonance performance, in the acoustic resonator 100 according to an example, a ratio $W_e/l_s$ of a maximum width $W_e$ of the second electrode 125a and the length $l_s$ of the inclined surface within the extension portion E may be defined in a range of 0.46 to 0.92. However, an overall configuration of an example is not limited to the above range, and the range may be changed according to a change in sizes of the inclination angle θ or in thicknesses of the insertion layer 170.

Here, when the second electrode is disposed in the entirety of the extension portion E over the inclined portion 1231 of the piezoelectric layer, as illustrated in FIGS. 3 and 4, when a width $W_e$ of the second electrode 125 in the extension portion E is 2.2 μm, 4.2 μm, or 6 μm, a peak of attenuation was measured.

Moreover, as illustrated in FIG. 3, as an area, in which the second electrode 125 and the insertion layer 170 are overlapped, becomes larger, a value of $Kt^2(\%)$ of the acoustic resonator may decrease. In this regard, because an inefficient area due to the insertion layer 170 becomes larger, the value of $Kt^2(\%)$ of the acoustic resonator may decrease.

Thus, in order to obtain different values of $Kt^2(\%)$ for each acoustic resonator, an area, in which the insertion layer 170 and the second electrode 125 are overlapped, may be differently applied for each acoustic resonator, and thus a degree of design freedom may be increased in terms of the filter design.

In an acoustic resonator according to an example described above, since the extension portion E of the resonant portion 120 is formed to have a thickness, greater than a thickness of the center portion S, due to the insertion layer 170, a Q-factor of an acoustic resonator may be increased by suppressing vibrations, generated by the center portion S, from escaping outwardly.

Moreover, the second electrode 125 may be partially disposed in the extension portion E, thereby providing a remarkably improved resonance performance.

In addition, when the insertion layer 170 is formed using an aluminum alloy (AlSc) containing scandium (Sc), a crystal orientation of a piezoelectric layer 123, deposited above the insertion layer 170, becomes better. Thus, heat release in a lateral direction of a resonator may be obtained more smoothly.

Meanwhile, the acoustic resonator according to an example is not limited to the above-mentioned example, and may be modified in various ways.

Figure 5:
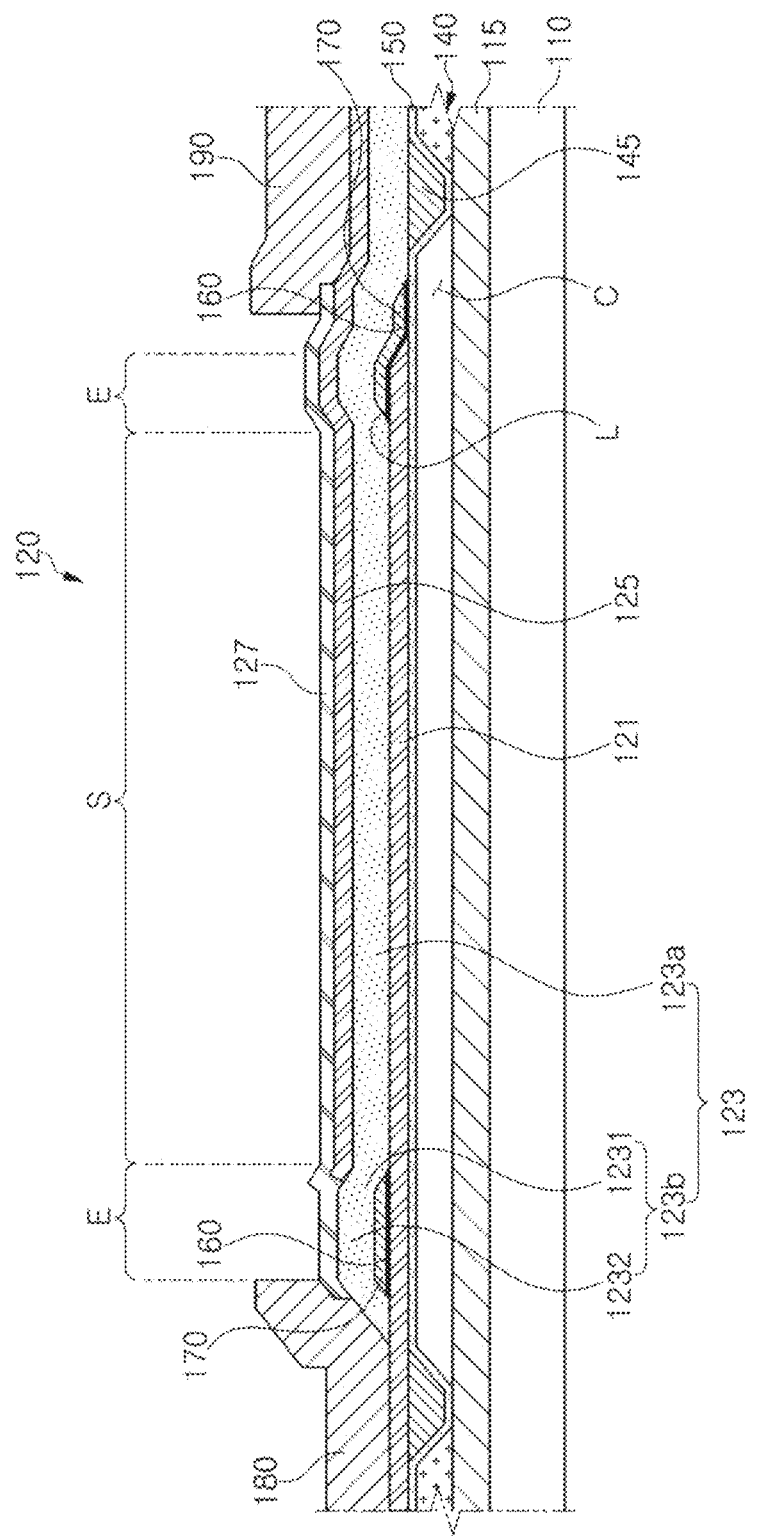
FIG. 5 is a schematic cross-sectional view illustrating an acoustic resonator according to one or more embodiments.

FIG. 5 is a schematic cross-sectional view illustrating an acoustic resonator according to one or more embodiments, and a cross-sectional view taken along line I-I' of FIG. 1.

Referring to FIG. 5, a portion of the insertion layer 170 of an acoustic resonator according to an example, supporting the piezoelectric layer 123, is left, and all remaining portions are removed from the resonant portion 120. As described above the insertion layer 170 may be partially disposed, as necessary.

When the acoustic resonator is configured as described above, the insertion layer 170 may be disposed so as not to be in contact with the first metal layer 180 or the etch-stop portion 145. Moreover, the insertion layer 170 may not be disposed outwardly of the resonant portion 120, but may be disposed within an upper region of the cavity C. However, a region in which the insertion layer 170 is disposed is not limited thereto.

Figure 6:
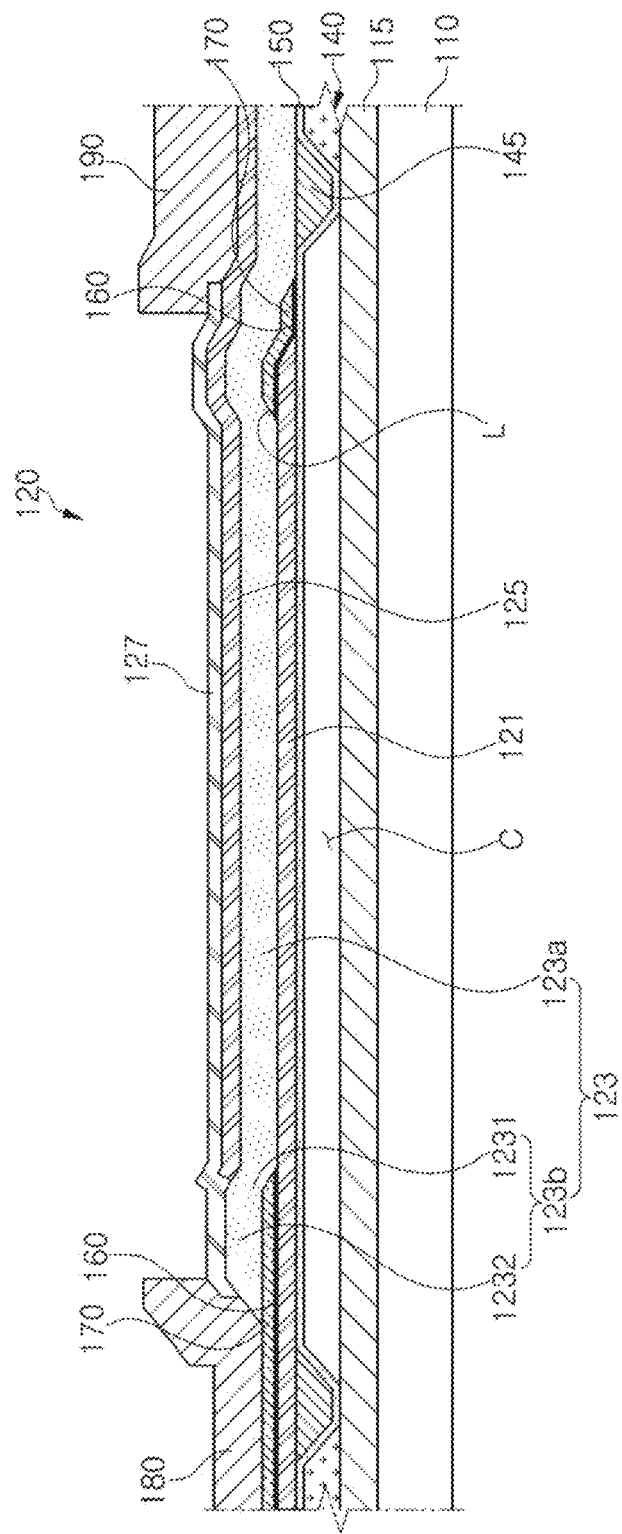
FIG. 6 is a schematic cross-sectional view illustrating an acoustic resonator according to one or more embodiments.

FIG. 6 is a schematic cross-sectional view illustrating an acoustic resonator according to one or more embodiments, and a cross-sectional view taken along line I-I' of FIG. 1.

Referring to FIG. 6, the insertion layer 170 of an acoustic resonator according to an embodiment may be disposed between the first electrode 121 and the first metal layer 180, thereby electrically connecting the first electrode 121 to the first metal layer 180.

Since the insertion layer 170 is formed of a metal material, an electrical path between the first electrode 121 and the first metal layer 180 may be extended by the insertion layer 170 in a portion of the extension portion E. This configuration may lower wiring resistance of the first electrode 121 in the extension portion E or in the vicinity thereof. Thus, insertion loss of an acoustic resonator may be reduced.

As set forth above, according to an example, in a bulk-acoustic wave resonator, as an insertion layer is formed using an aluminum alloy (AlSc) containing scandium (Sc), a crystal orientation of a piezoelectric layer, deposited above an insertion layer, may be improved. Thus, heat release in a lateral direction of a resonator is smoothly performed, so heat dissipation efficiency may be increased.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk-acoustic wave resonator, comprising:
a substrate;
a resonant portion, comprising a first electrode, a piezoelectric layer, and a second electrode sequentially stacked on the substrate, and further comprising a center portion, and an extension portion that is disposed along a periphery of the center portion; and
an insertion layer that is disposed in the extension portion between the first electrode and the piezoelectric layer, wherein the insertion layer is formed of an aluminum alloy containing scandium (Sc).

2. The bulk-acoustic wave resonator of claim 1, further comprising:
a seed layer formed of a metal material, and disposed between the first electrode and the insertion layer.

3. The bulk-acoustic wave resonator of claim 2, wherein the seed layer is formed of a metal having a hexagonal close packed (HCP) crystal structure.

4. The bulk-acoustic wave resonator of claim 3, wherein the seed layer is formed of one of a titanium (Ti) element and a ruthenium (Ru) material.

5. The bulk-acoustic wave resonator of claim 1, wherein the piezoelectric layer is formed of one of aluminum nitride (AlN) and doped aluminum nitride that contains a rare earth metal.

6. The bulk-acoustic wave resonator of claim 5, wherein the rare earth metal is formed of a metal containing one of scandium, erbium, yttrium, and lanthanum, or combinations thereof.

7. The bulk-acoustic wave resonator of claim 1, wherein the content of the scandium (Sc) is 0.1 at % to 5 at %.

8. The bulk-acoustic wave resonator of claim 1, wherein the insertion layer has a thickness of 100 Å or more, and has a thickness less than a thickness of the piezoelectric layer.

9. The bulk-acoustic wave resonator of claim 1, wherein the insertion layer has an inclined surface that has a thickness that increases as a distance of the inclined surface increases from the center portion, and
the piezoelectric layer comprises an inclined portion that is disposed on the inclined surface.

10. The bulk-acoustic wave resonator of claim 9, wherein the second electrode is provided with at least a portion thereof disposed on the inclined surface of the inclined portion of the piezoelectric layer.

11. The bulk-acoustic wave resonator of claim 1, further comprising:
a protective layer stacked on the second electrode.

12. The bulk-acoustic wave resonator of claim 1, wherein the piezoelectric layer comprises a piezoelectric portion disposed in the center portion, and a bent portion disposed in the extension portion, and extended from the piezoelectric portion to be inclined along a shape of the insertion layer.

13. A bulk-acoustic wave resonator, comprising:
a substrate;
a resonant portion, comprising a first electrode, a piezoelectric layer, and a second electrode sequentially stacked on the substrate;
an insertion layer disposed between the piezoelectric layer and the first electrode, and configured to be formed with an aluminum alloy containing scandium in a range of 0.1 at % to 5 at %; and
a seed layer, disposed between the insertion layer and the first electrode, and formed to contain one of a titanium element and a ruthenium material.

14. The bulk-acoustic wave resonator of claim 13, wherein the titanium element of the seed layer has a hexagonal close packed (HCP) crystal structure.

15. The bulk-acoustic wave resonator of claim 13, wherein the insertion layer has a face-centered cubic (FCC) crystal structure.

* * * * *